United States Patent [19]

Seaman

[11] 4,075,556
[45] Feb. 21, 1978

[54] TEST FIXTURE FOR MINIATURE CAPACITORS

[75] Inventor: Harry V. Seaman, Northport, N.Y.

[73] Assignee: American Technical Ceramics, division of Phase Industries Inc., Huntington Station, N.Y.

[21] Appl. No.: 763,346

[22] Filed: Jan. 28, 1977

[51] Int. Cl.$^2$ .................. G01R 11/52; G01R 27/26
[52] U.S. Cl. .................. 324/60 C; 361/413
[58] Field of Search .................. 361/413; 324/59, 60, 324/73

*Primary Examiner*—John Kominski
*Attorney, Agent, or Firm*—Edward H. Loveman

[57] ABSTRACT

A test fixture for a miniature polygonal capacitor having radial and/or axial terminal leads and/or conductive end electrodes, includes an insulative support on which are two brackets to which is secured a shield plate assembly. The shield plate assembly is comprised of a pair of slightly spaced parallel trapezoidal shield plates. Opposing inner edges of the plates are angularly disposed to facilitate receiving the capacitor under test, when the axial terminal leads of the capacitor enter between the shield plates. Another shield plate assembly is mounted to and under the brackets, and includes another pair of parallel shield plates disposed perpendicular to the upper trapezoidal shield plates and between the angular edges to receive any radial lead of the capacitor. Connectors for the external capacitor measuring device are secured to the conductive brackets. A stiffener plate may be secured to the insulative plate to keep it rigid and prevent capacitance changes of the test fixture.

10 Claims, 6 Drawing Figures

TEST FIXTURE FOR MINIATURE CAPACITORS

This invention concerns a test fixture for miniature capacitors having conductive end electrodes and/or radial and/or axial terminal leads.

Heretofore, test fixtures for such miniature capacitors have been quite complex and elaborate in construction. While such test fixtures may be suitable for use by manufacturers of capacitors, they are too complex and expensive to be widely used by capacitor users. Additionally, the usual spring contact test fixtures differ in their capacity value, being dependent upon the physical size of the capacitor and thereby limiting their ultimate accuracy.

Accordingly, the invention provides a capacitor holding device having two pairs of coplanar spaced, flat, trapezoidal electrode plates which serve as lead shields. The shield plates are trapezoidal in form with adjacent angularly disposed edges. A capacitor whose capacitance is to be measured is inserted between adjacent edges of the shield plates. The leads at opposite ends of the capacitor body are engaged between the pairs of spaced shield plates. The shield plates are mounted rigidly and securely on conductive brackets attached to an insulative base. Terminal electrodes are connected to the brackets. Terminals of a conventional capacitance measuring bridge or meter are quickly attachable to the terminal electrodes of the test fixture. The ends of the capacitor being measured are snugly engaged between the angled adjacent edges of the lead shield plates, and are readily removable therefrom.

To measure the capacitance of the capacitor in the test fixture, the capacitance of the test fixture along, without any capacitor in it, is first determined. This measurement is referred to as capacitance C1. Then a capacitor to be measured is inserted into the fixture. The capacitance of the test fixture and capacitor are measured and the new measurement is referred to as C2. The capacitance of the capacitor is then $C_c$:

$$C_c = C2 - C1.$$

The readings or scale of the bridge or meter used to obtain capacitance readings when using the test fixture may be calibrated to reduce all capacitance reading by C1, the capacitance of the test fixture, so that direct capacitance readings are obtained when measuring capacitors in the test fixture. Since the construction of the test fixture is rigid, and the effects of stray capacitance due to capacitor leads are suppressed, capacitance value C1 remains constant. Thus capacitance measurements or readings are obtained for capacitors inserted into the test fixture, are commensurate with the accuracy of the bridge or meter used with the test fixture for capacitance readings.

It is a principal object of the present invention to provide a capacitor test fixture which is simplified in construction and useful as a holding device for a miniature capacitor while the capacitance of the capacitor is being measured.

Another object of the invention is to provide a capacitor test fixture which is rigid and will not change its dimensions due to insertion of a capacitor.

Still another object of the present invention is to provide a capacitance test fixture wherein the points of measurement on a capacitor having terminal leads are precisely defined so that the same capacitance measurement is obtained for all capacitors having the same capacitance.

Yet another object of the present invention is to provide a capacitor test fixture wherein the definition or location of points of measurements is independent of actual lead configuration and position so that the leads do not effect the capacitance measurement.

A further object of the present invention is to provide a capacitor test fixture wherein identical repeat measurements are obtainable for any one capacitor.

A still further object of the present invention is to provide a capacitor test fixture wherein all capacitor leads both axial and radial are effectively shielded to prevent their capacitance from effecting the measurement of the capacitor's capacitance.

Yet a further object of the present invention is to provide a capacitor test fixture which is easy to use, permitting fast insertion and removal of capacitors measured.

An additional object of the present invention is to permit the accurate measurement of capacitors of different physical size.

These and other objects and many of the attendant advantages of this invention will be readily appreciated as the same becomes better understood by reference to the following detailed description when considered in connection with the accompanying drawings in which.

Figure 1:
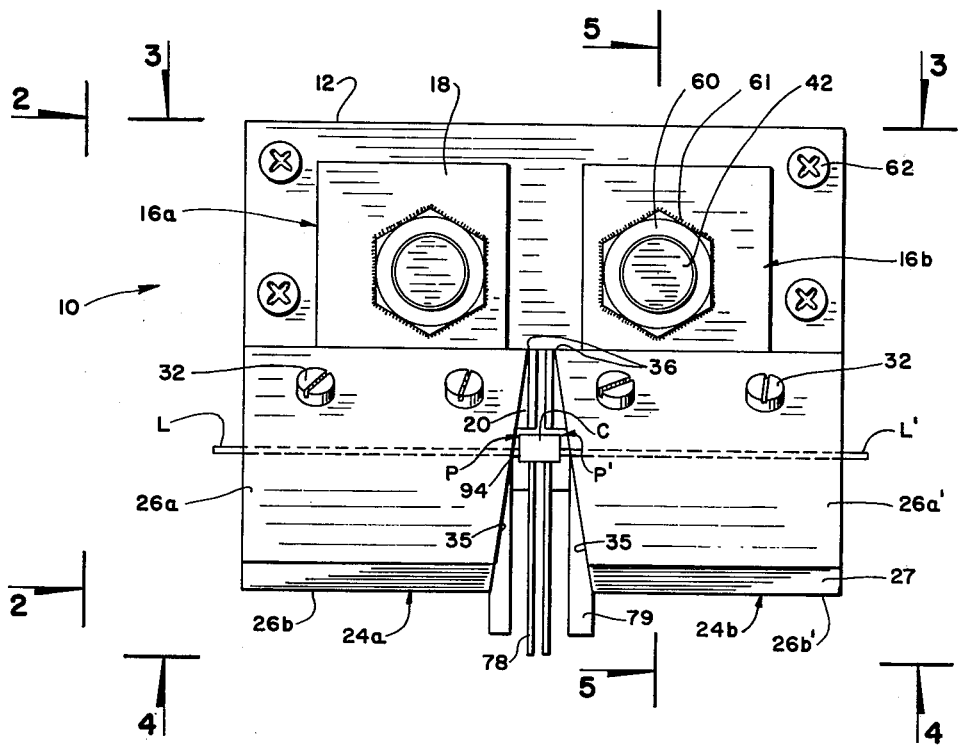
FIG. 1 is a front elevational view of a capacitor test fixture embodying the invention.
Figure 2:
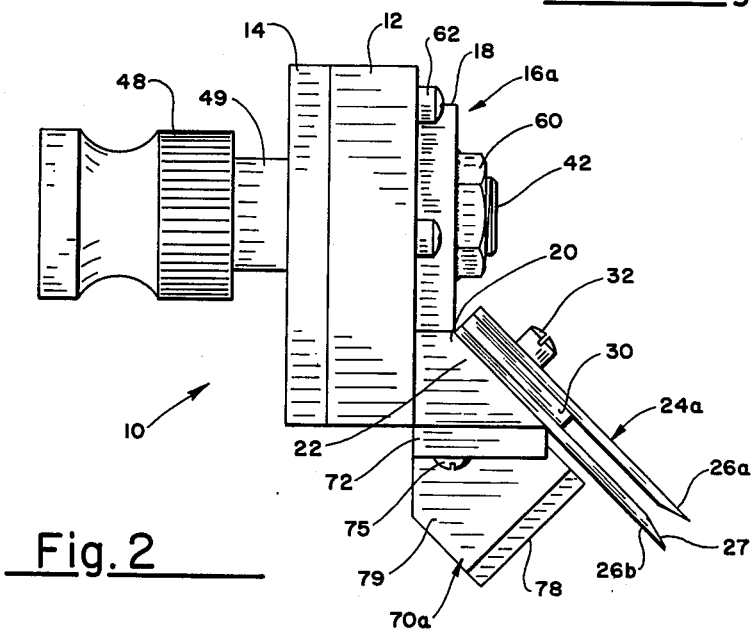
FIG. 2 is an end view of the test fixture, taken along line 2—2 of FIG. 1.
Figure 3:
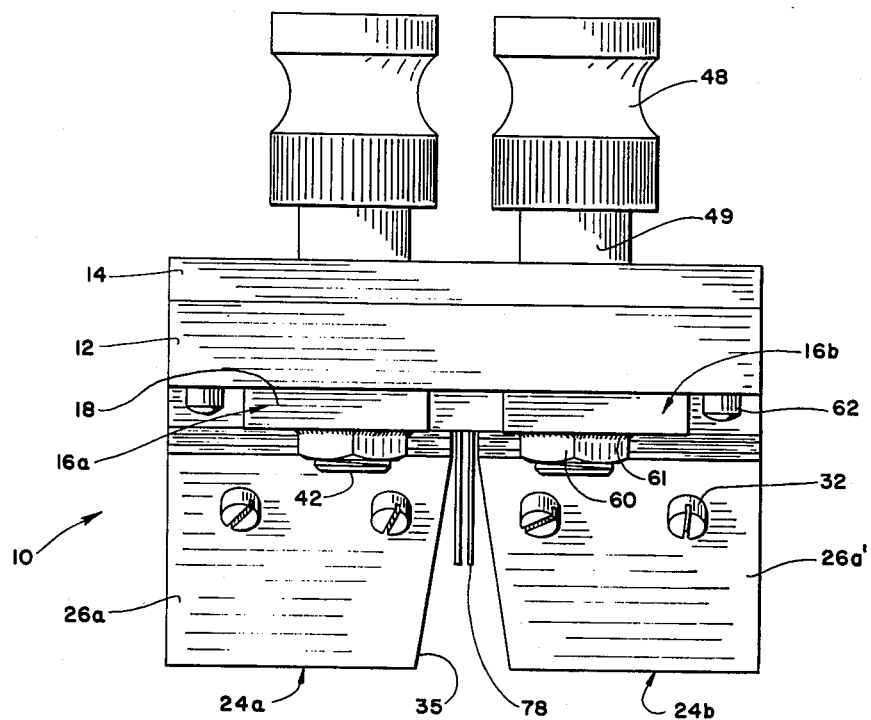
Figure 4:
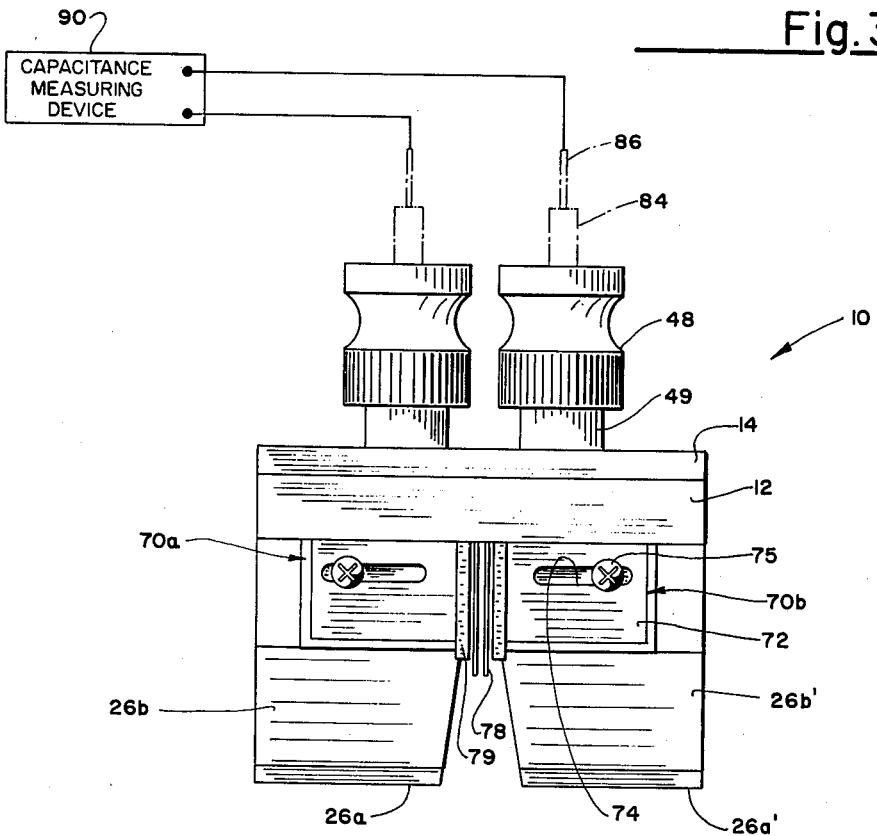
Figure 5:
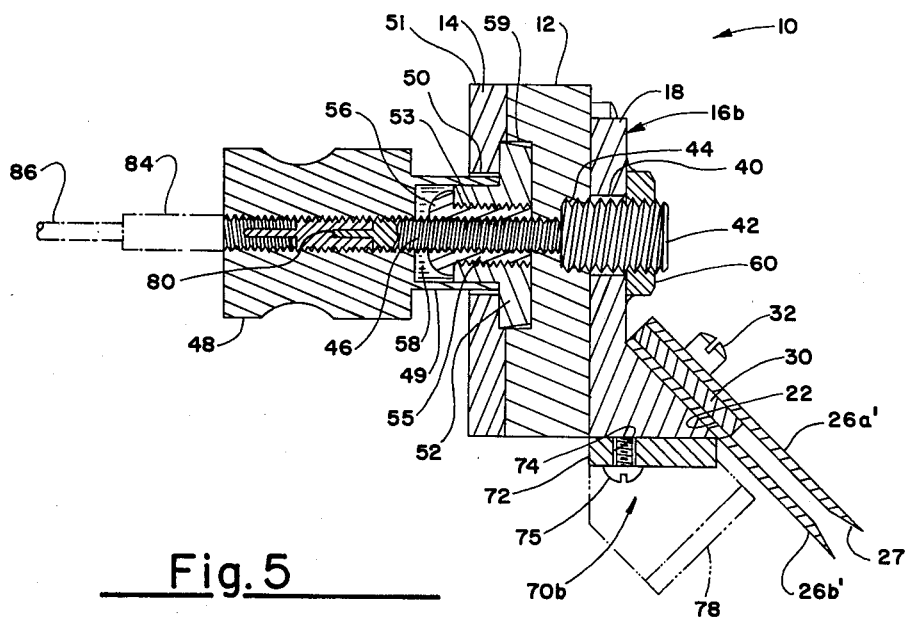

FIGS. 3 and 4 are top and bottom plan views of the test fixture taken along lines 3—3 and 4—4 respectively of FIG. 1;

FIG. 5 is a vertical cross sectional view taken along lines 5—5 of FIG. 1; and

Figure 6:
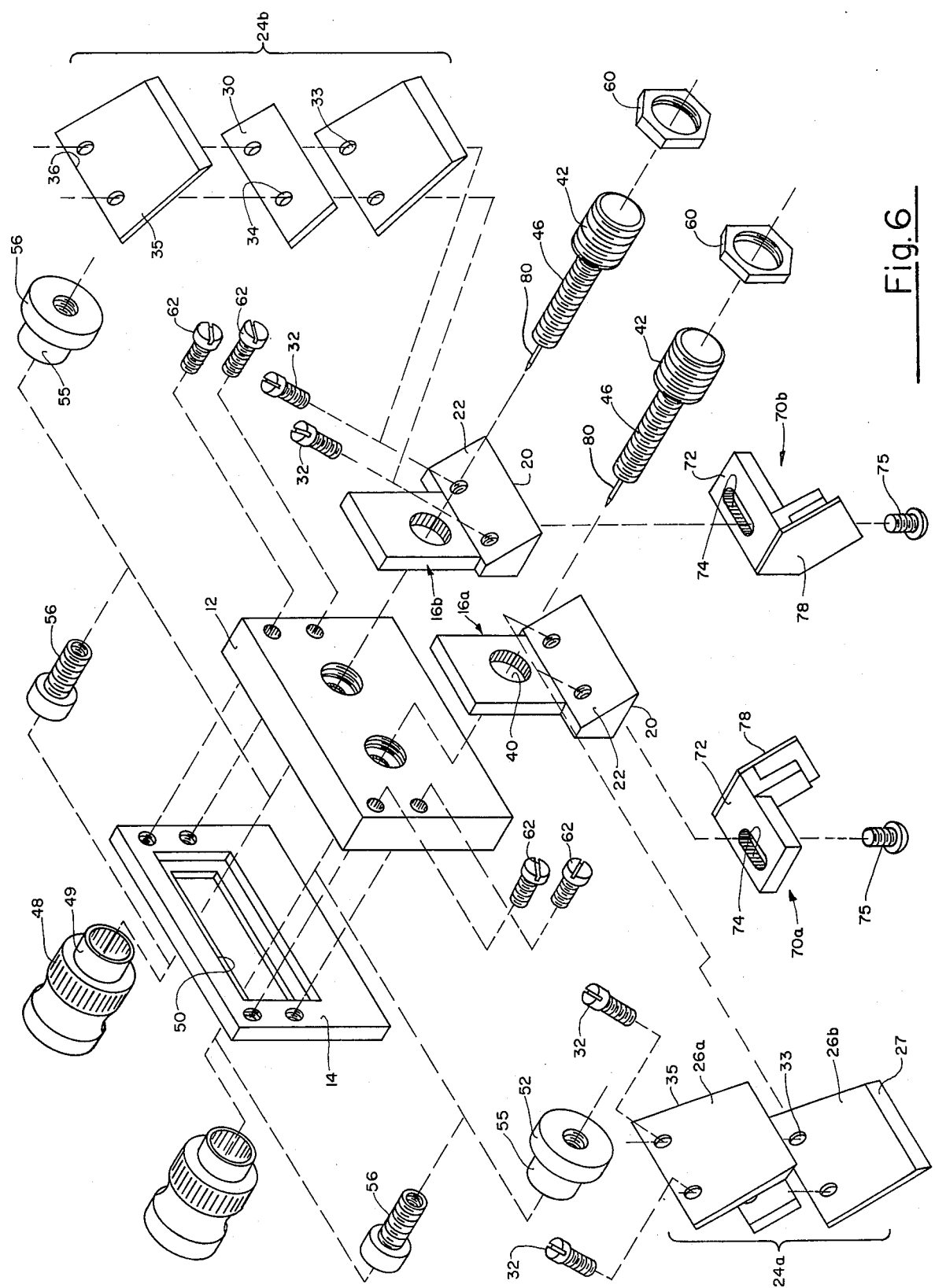

FIG. 6 is a reduced exploded perspective view showing parts of the test fixture.

Referring now to the drawings wherein like reference characters designate like or correspondng parts throughout, there is illustrated in FIGS. 1-6, a test fixture generally designated as reference numeral 10 having a massive insulative rectangular base plate 12. Abutted to the rear of the plate 12 is a rigid rectangular, metal stiffener plate 14 equal in length and width but thinner than the plate 12. Abutted to the front of the plate 12 is a pair of massive, conductive metal brackets 16a, 16b. Each of the brackets 16a, 16b, has a rectangular upper portion 18 and lower wedge shaped pedestal portion 20 longer than the lateral width of the upper portion 18. On the inclined top surface or face 22 of each of the pedestal portions 20 is secured a capacitor lead shield assembly generally designated as reference numerals 24a or 24b. Each of the assemblies 24a and 24b includes two flat, thin trapezoidal metal shield plates 26a, 26b; 26a', 26b', respectively held in fixed spaced relationship by a rectangular metal spacer plate 30. The plates 26a, 26b, 26a' and 26b' have facing beveled edges 27 to facilitate entry of axial leads L of capacitor C (FIG. 1). Two screws 32 secure each capacitor shield assembly 24a, 24b to the pedestal portions 20 of the brackets 18. The screws 32 are inserted through registering holes 33, 34 in the respective sheild plates 26a, 26b, 26a', 26b' and spacers (see FIG. 5). Adjacent edges 35 of the capacitor shield plates 26a, 26b, 26a', 26b', are disposed at a narrow angle to each other to facilitate entry and engagement of a capacitor C therebetween. At their upper, inner corners 36 the shield plates 26a, 26b and 26a', 26b' are slightly spaced apart. Thus the two capacitor shield assemblies 24a and 24b are insulated from each other in their mounting on the base plate 12.

Each bracket 16a, 16b, has a central hole 40 through which extends a bolt 42; see FIG. 5. The bolt 42 is threaded and seated in a bore 44 in the plate 12. The bolt 42 has a threaded axial shank 46 on which is engaged a thumb nut 48 at the back of the plate 12. An inner cylindrical end 49 of the nut 48 extends through a slot 50 in the plate 14. The slot 50 is wider than the end 49 of the nut 48 which bears on an annular head 51 of an insulator 52. The insulator 52 has a threaded bore 53 for engaging a screw 56. The screw 56 and a shank 55 of the insulator 52 fit in a bore 58 formed in a nut 48. The head 51 of the insulator 52 seats in a bore 59 formed in the rear side of the insulator plate 12. A lock nut 60 is engaged in the front end of the bolt 42 which extends beyond the front of the bracket portion 18. The lock nut 60 is locked in place by solder fillet 61. Four screws 62 secure the plate 12 to the plate 14.

At the bottom of the fixture 10 are two conductive shield plate assemblies 70a, 70b for radial leads (if any) of the capacitor being tested. Each radial lead shield assembly 70a, 70b has a rectangular plate portion 72 provided with a slot 74. A screw 75 extends through the slot 74 and is engaged in a threaded hole in the bottom portion 20 of each bracket 16a, 16b. Each shield 70a, 70b, has a lateral arm 76 to which is attached a thin metal shield plate 78 and an integral lateral wall 79. Plates 78 are disposed in parallel position underneath the assemblies 24a, 24b and perpendicular thereto and adjacent the angular edges 35, for receiving any radial lead of the capacitor C.

The shanks 46 of the bolts 42 terminate in metal pins 80 which serve as connector members for receiving sockets 84 of circuit terminals 86 shown in dotted lines diagrammatically in FIGS. 4 and 5. These terminals are parts of an external capacitance measuring bridge or metering device 90.

In operation, the rectangular capacitor C (shown in FIG. 1) is inserted between the adjacent angular edges 35 of the capacitor shield plates 26a, 26b, 26a', 26b'. Leads L and L' of the capacitor C extend between the slightly spaced pair of the shield plates. The capacitor C has end electrodes 94 which are pressed into contact with the edges of the capacitor shield plates at corresponding points P, P'. The capacitance effect of the leads is effectively neutralized, so that the calibrated capacitance measuring device 90 accurately reads the capacitance of the capacitor C. After the capacitance is read, the capacitor can easily be removed and replaced by another capacitor to be measured.

It should be understood that the foregoing relates to only a preferred embodiment of the invention, and that it is intended to cover all changes and modifications of the example of the invention herein chosen for the purposes of the disclosure, which do not constitute departures from the spirit and scope of the invention.

The invention claimed is:

1. A test fixture for a miniature capacitor having terminal leads and conductive ends, comprising an insulative support; two shield plate assemblies mounted on said support in coplanar spaced disposition, each shield plate assembly comprising:
   a pair of flat conductive shield plates disposed parallel to each other with edges in registration; and
   a spacer plate disposed between said shield plates, for receiving an axial one of said terminal leads between said shield plates and opposing inner edges of said spaced shield plate assemblies being disposed angularly to each other for engaging opposite conductive ends of said capacitor therebetween.

2. A test fixture as defined in claim 1, comprising a further pair of shield plate assemblies secured to said support and including a pair of other flat conductive shield plates disploSed parallel to each other, perpendicular to said first named shield plate assemblies and underneath the same adjacent to said opposing inner edges of said first named shield assemblies, for receiving and shielding any radial terminal lead of said capacitor.

3. A test fixture as defined in claim 1, wherein each of said shield plates is trapezoidal in form, and wherein each of said pair of parallel shield plates has opposing beveled edges adjacent said inner edges to facilitate entry of an axial lead of said capacitor therebetween.

4. A test fixture as defined in claim 1, further comprising a pair of electrical connectors arranged in direct electric circuit with said pair of shield plate assemblies for connection to an external capacitance measuring device.

5. A test fixture as defined in claim 1, wherein said support comprises an insulative plate, and pair of conductive brackets, and means securing said shield plate assemblies respectively to said brackets.

6. A test fixture as defined in claim 5, further comprising a stiffener plate secured to said insulative plate to prevent flexing and dimensional change of said insulative plate.

7. A test fixture as defined in claim 5, comprising a further pair of shield plate assemblies secured respectively to said brackets, each of said further pair of shield plate assemblies comprising a pair of other flat conductive shield plates disposed parallel to each other, perpendicular to said first named shield plate assemblies and underneath the same adjacent to said opposing inner edges of said first named shield plate assemblies, for receiving and shielding any radial terminal lead of said capacitor.

8. A test fixture as defined in claim 7, wherein each of said shield plates of said first named shield plate assemblies is trapezoidal in form, and wherein each parallel pair of said first named shield plates has opposing beveled edges adjacent said inner edges to facilitate entry of an axial lead of said capacitor therebetween.

9. A test fixture as defined in claim 7, further comprising a pair of electrical connectors arranged in direct electric circuit with said first named and said further pair of shield plate assemblies for connection to an external capacitance measuring device.

10. A test fixture as defined in claim 9, wherein said electrical connectors comprise bolts extending through said brackets and insulation plate, and nuts engaged on ends of the bolts for receiving terminals of said capacitance measuring device.